United States Patent [19]

Furuno

[11] Patent Number: 5,363,057
[45] Date of Patent: Nov. 8, 1994

[54] CONTROL DEVICE FOR POWER AMPLIFIER

[75] Inventor: Kenichi Furuno, Amagasaki, Japan

[73] Assignee: Mitsubishi Denki Kabushiki Kaisha, Tokyo, Japan

[21] Appl. No.: 7,966

[22] Filed: Jan. 22, 1993

[30] Foreign Application Priority Data

Jan. 30, 1992 [JP] Japan .................................. 4-014768

[51] Int. Cl.$^5$ ............................................. H03G 3/30
[52] U.S. Cl. .................................... 330/129; 330/138; 330/279; 330/280; 330/289
[58] Field of Search .............. 330/127, 129, 138, 278, 330/279, 280, 289; 455/116, 126, 127

[56] References Cited

U.S. PATENT DOCUMENTS

| | | | |
|---|---|---|---|
| 4,754,231 | 6/1988 | Sawa | 330/279 |
| 4,992,253 | 2/1991 | Jensen | 330/129 |
| 5,081,713 | 1/1992 | Miyazaki | 455/126 |
| 5,128,629 | 7/1992 | Trinh | 330/129 |
| 5,138,274 | 8/1992 | Nakanishi et al. | 330/136 |
| 5,159,283 | 10/1992 | Jensen | 330/129 |

FOREIGN PATENT DOCUMENTS

| | | | |
|---|---|---|---|
| 0414352 | 2/1991 | European Pat. Off. . | |
| 244107 | 12/1985 | Japan | 330/279 |
| 62-177987 | 8/1987 | Japan . | |
| 62-261232 | 11/1987 | Japan . | |
| 63-77205 | 4/1988 | Japan . | |
| 1-154614 | 6/1989 | Japan . | |
| 251904 | 2/1990 | Japan . | |
| 2-260709 | 10/1990 | Japan . | |
| 94527 | 4/1991 | Japan | 455/127 |
| 8404215 | 10/1984 | WIPO . | |
| 9112661 | 8/1991 | WIPO . | |
| 9204771 | 3/1992 | WIPO . | |

Primary Examiner—James B. Mullins
Attorney, Agent, or Firm—Rothwell, Figg, Ernst & Kurz

[57] ABSTRACT

A control device for a power amplifier controls the power amplifier upon a rise in output power based on a power variation pattern stored in storage means to suppress a power overshoot which occurs upon a rise in output power.

9 Claims, 5 Drawing Sheets

CONTROL DEVICE FOR POWER AMPLIFIER

BACKGROUND OF THE INVENTION

1. Field of the Invention

The present invention relates to a control device for power amplifiers which are used in cellular radio telephones, portable telephones and the like and which need to change output power thereof.

2. Description of the Prior Art

FIG. 11 is a block diagram of a conventional automatic output power control circuit. In the figure, reference numeral 1 represents an amplifier to be controlled, 2 an output detector for detecting the output of this amplifier 1, 10 a variable voltage generator circuit for changing output power through resistance division, 4 a D.C. amplifier for amplifying the difference between the detection output of the output detector 2 and the variable output voltage of the variable voltage generator circuit 10, and 5 a source current control circuit for controlling the source current of the amplifier 1 with the output of the D.C. amplifier 4 to change the output of the amplifier 1.

In a car telephone, for example, output power is limited to 8 levels up to 4.0 W in increments of 4 dB, and a mobile station needs to change its output power to a level prescribed by a fixed station.

Next, the operation of the control device will be described. The output of the amplifier 1 is detected by the output detector 2 and the detected output is supplied to the D.C. amplifier 4. To this D.C. amplifier 4, an output voltage from the variable voltage generator circuit 10 is also applied. The difference between these voltages is measured by the D.C. amplifier 4 and this differential voltage is transmitted to the source current control circuit 5. This source current control circuit 5 changes the source current of the amplifier 1 according to this differential voltage in order to change the amplifier output power. In this way, the output power of the amplifier 1 can be controlled by changing the output voltage of the variable voltage generator circuit 10.

Since the conventional automatic output power control circuit is structured as described above, it induces such problems as amplifier overshooting, amplifier emission of an undesired spectrum, and the like when amplifier output power is turned ON and OFF, or amplifier output power is changed, because the output of the variable voltage generator circuit may be constant or vary stepwise.

SUMMARY OF THE INVENTION

The present invention is intended to solve the above-mentioned problems, and it is an object of the invention to provide a control device for power amplifiers which can suppress an overshoot and the emission of an undesired spectrum.

The control device for power amplifiers according to the present invention comprises storage means for storing a power variation pattern and a control section for changing a control signal based on this power variation pattern stored in the storage means.

The control section can control the amplifier according to a power variation level upon a rise or fall in power level, or switching of power level to change the output of the amplifier.

DESCRIPTION OF THE PREFERRED EMBODIMENT

Embodiment 1

Figure 1:
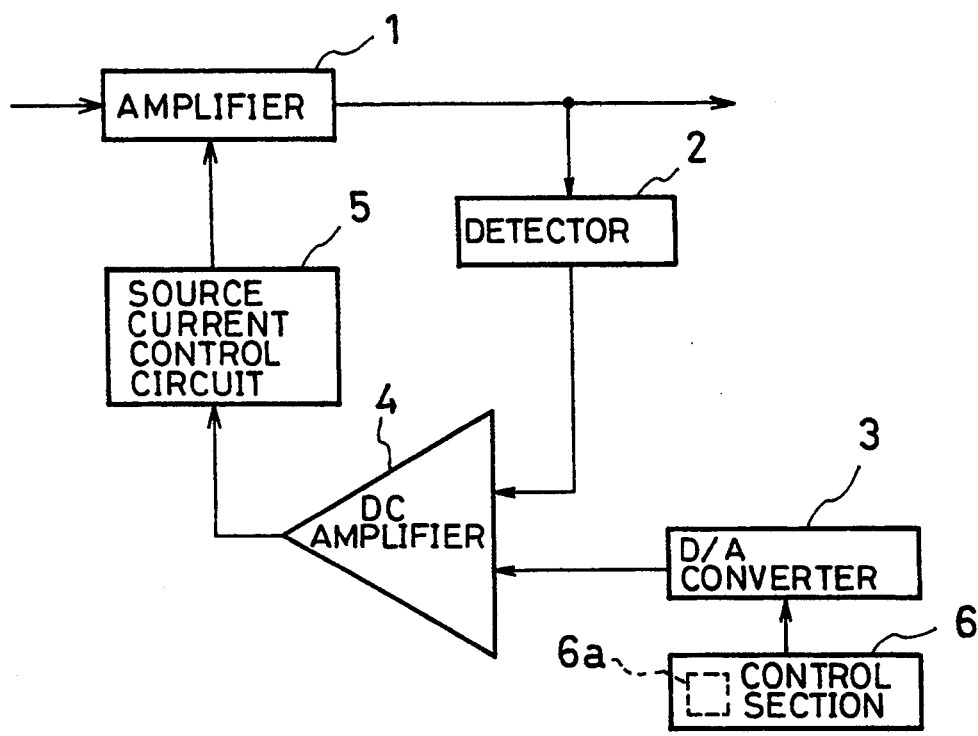
FIG. 1 is a block diagram of Embodiment 1 of the present invention.
Figure 2:
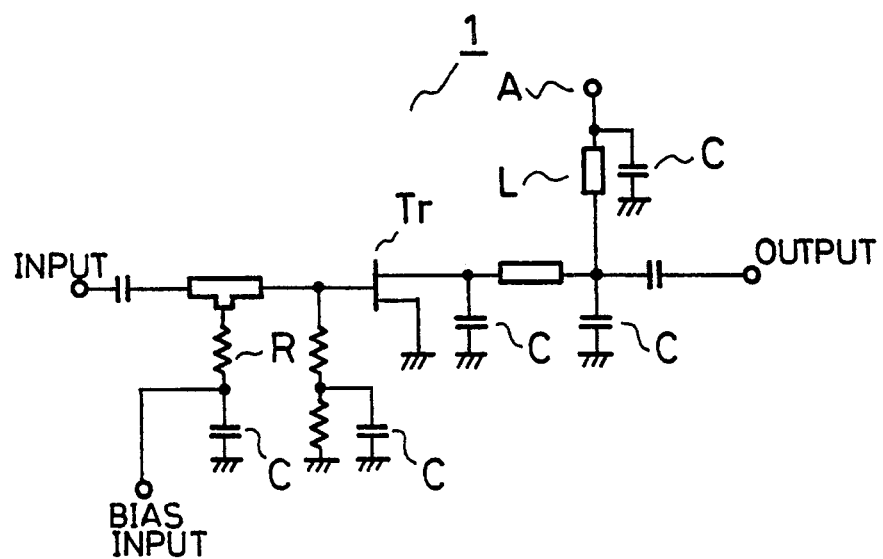
FIG. 2 is a circuit diagram showing an example of the amplifier constituting Embodiment 1.
Figure 3:
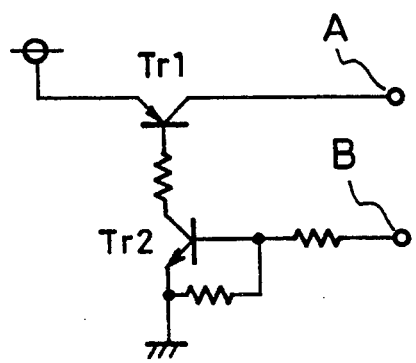
FIG. 3 is a circuit diagram of an example of the source current control circuit constituting Embodiment 1.

A preferred embodiment of the present invention will be described hereinunder with reference to accompanying drawings. In FIG. 1, reference numeral 1 represents a power amplifier for amplifying power which changes a source current to vary output power thereof and, as shown in FIG. 2, a power amplifier IC which comprises a transistor Tr, many inductances L and capacitors C is already known. Numeral 2 represents an output detector for detecting the output of the amplifier 1, 3 a D/A converter for generating a reference voltage for changing output power as a reference voltage generating means, 4 a D.C. amplifier for measuring and amplifying the difference between the detection output of the output detector 2 and the reference voltage output of the D/A converter 3 as a differential amplifying means, and 5 a source current control circuit for controlling the source current of the amplifier 1 according to the output of the D.C. amplifier 4 to change the output of the amplifier 1. As shown in FIG. 3, since the source current control circuit comprises transistors Tr1 and Tr2, when the voltage (current) of a terminal B is changed, the transistor Tr1 is turned on, whereby a current passing through the transistor Tr1 can be changed. In this case, a terminal A is connected to a terminal A in FIG. 2. Numeral 6 in FIG. 1 represents a control section for controlling the D/A converter 3 for generating a reference voltage according to the variation pattern shown in FIG. 4, for instance, stored in the storage means 6a in FIG. 1.

Next, the operation of this control device will be described. The output of the amplifier 1 in FIG. 1 is detected by the output detector 2 and the detected output is supplied to the D.C. amplifier 4. To this D.C. amplifier 4, a reference voltage output from the D/A converter 3 is also applied. The difference between these voltages is measured by the D.C. amplifier 4 and the differential voltage is transmitted to the source current control circuit 5. The source current control circuit 5 changes the source current of the amplifier 1 according to this differential voltage to vary the output power of the amplifier 1. In this way, the output power of the amplifier 1 can be controlled by changing the output voltage of the D/A converter 3 with the control section 6.

The above operation is the same as that of the prior art. However, the output voltage of the D/A converter 3 is changed stepwise up to a final value shown in FIG. 4 upon a rise in output power, for instance, by the control section 6 at a slower speed than the response speed of a closed loop constructed by the amplifier 1, the detector 2, the D.C. amplifier 4 and the source current control circuit 5. This makes it possible to suppress a power overshoot which occurs upon a rise in output power. The emission of an undesired spectrum can also be suppressed by changing the output status of the D/A converter 3.

Figure 4:
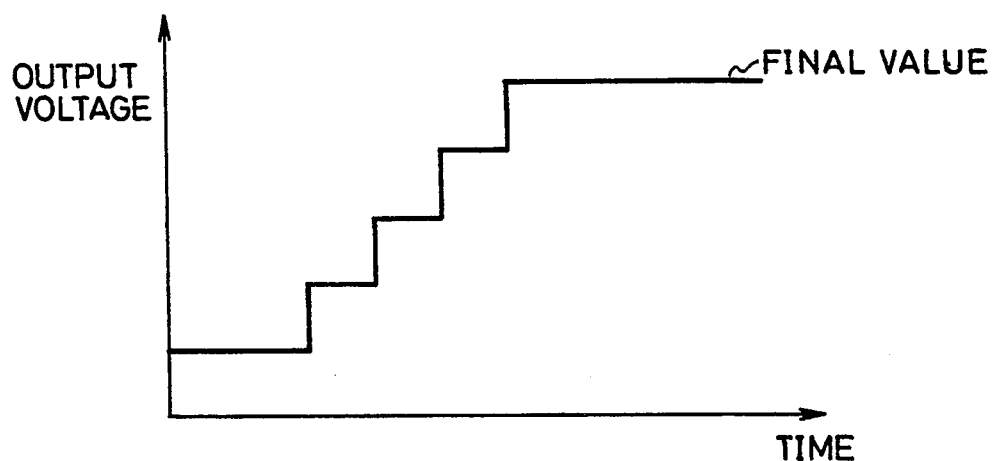
FIG. 4 is a characteristic diagram showing the contents of storage means 6a constituting Embodiment 1.

A description is subsequently given of the control method through the use of the actual control section 6. Generally speaking (in a cellular radio telephone or the like), since a time interval during which output power is turned from OFF to ON, from ON to OFF, or switched is specified in technical specifications, output power may be changed within this time interval until it reaches the final value shown in FIG. 4. Even if the response time of a closed loop constructed by the D.C. amplifier, the source current control circuit, the amplifier and the detector is fast, output power follows the output value of the D/A converter. The output of the D/A converter is increased stepwise by the timer of the control section 6. This duration set to increase the output of the D/A converter is a value obtained by dividing the time interval specified in technical specifications by the number of steps as described in the foregoing. In FIG. 4, the number of steps is 4.

Figure 5:
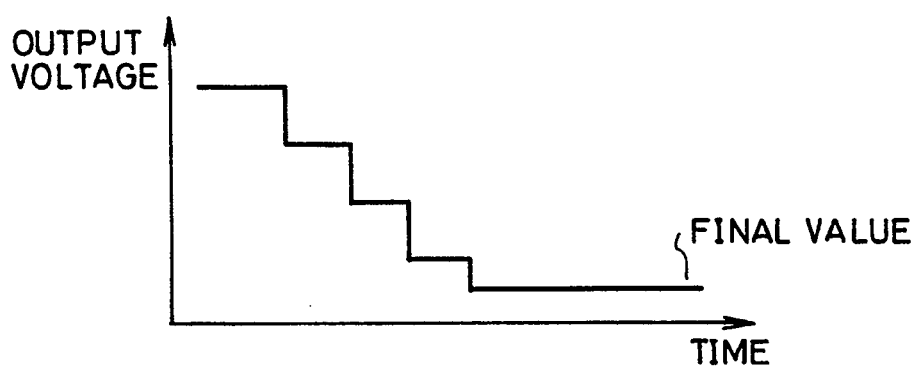
FIG. 5 is a characteristic diagram for explaining a variation of the present invention.

In the above embodiment, a description was given of the case where output power rises. When output power is turned off, that is, when output power drops, output power is controlled to follow the variation pattern stored in the storage means 6a as shown in FIG. 5. Also, when the level of output power is switched, the same effect can be achieved by changing the output of the D/A converter 3 stepwise based on the variation pattern stored in the storage means 6a.

Embodiment 2

Figure 6:
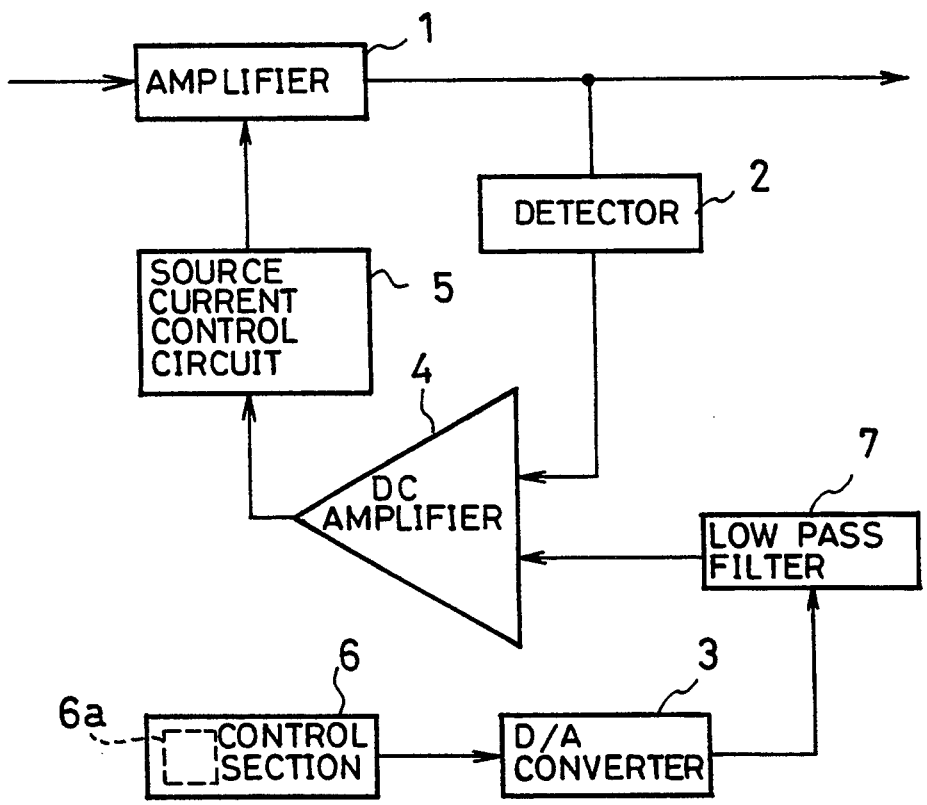
FIG. 6 is a diagram of Embodiment 2 of the present invention.

In the above embodiment, the number of steps, resolution and switching time of the D/A converter 3 are satisfactory until output voltage reaches the final value. When the number of steps, resolution and conversion time are unsatisfactory, or a more continuous variation is necessary, a delay circuit such as a low-pass filter 7 may be inserted between the D.C. amplifier 4 and the D/A converter 3 as shown in FIG. 6.

Figure 7:
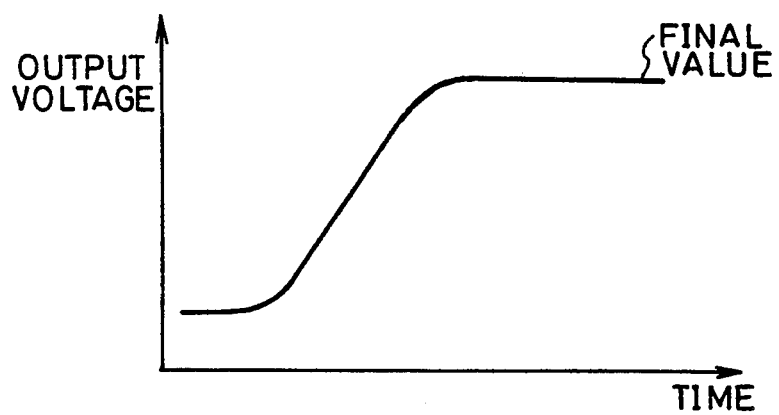
FIG. 7 is a diagram for explaining the operation of Embodiment 2.

FIG. 7 is a diagram showing output from the low-pass filter 7 to which a voltage increasing stepwise, as shown in FIG. 4, is inputted from the D/A converter 3 and which outputs a voltage increasing continuously as shown in FIG. 7. In this way, output from the D.C. amplifier 4 is made continuous by the continuation of the output voltage of the low-pass filter 7, thus making possible finer control. However, in this case, it is necessary to advance the output of the D/A converter 3 by a time equal to the delay time induced by the low-pass filter 7.

Embodiment 3

Figure 8:
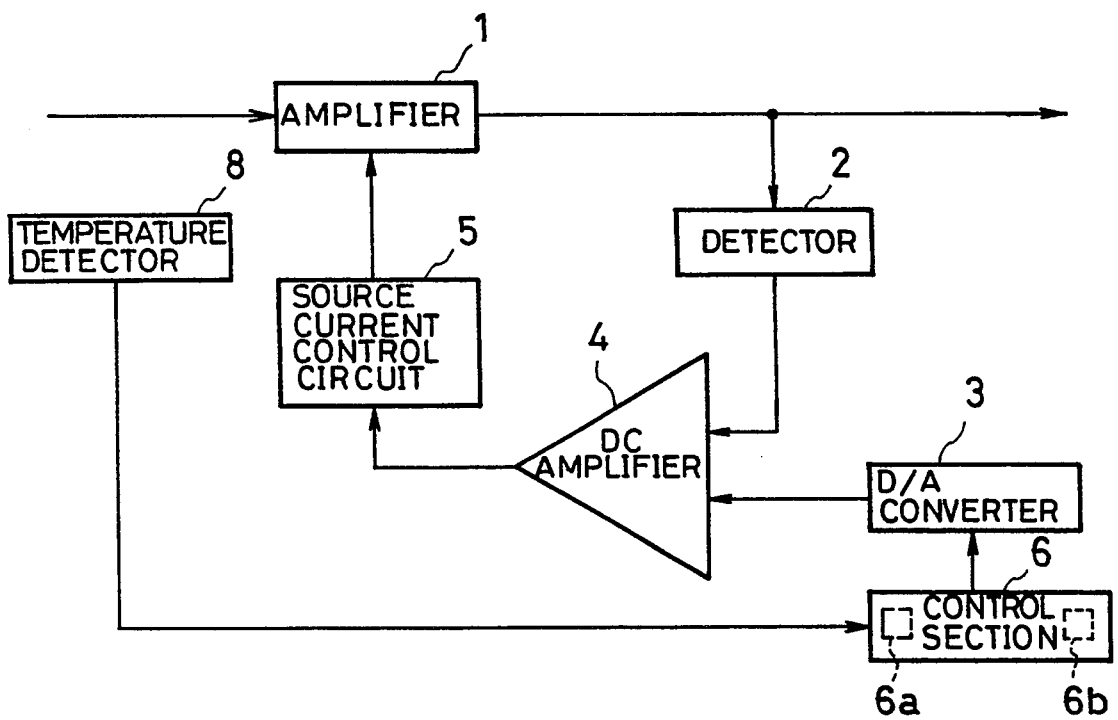
FIG. 8 is a block diagram of Embodiment 3 of the present invention.

When this circuit is used in a wide range of temperatures, a temperature correction section 6b which controls the output of the control section 6 based on a signal from a temperature detector 8 such as a thermistor, as shown in FIG. 8, may be provided to compensate for the temperature variations of the amplifier 1. In this case, the output voltage of the D/A converter 3 is changed so that the control section 6 can correct the temperature characteristics of the amplifier 1 and the detector 2 based on this correction information from the temperature correction section 6b.

For instance, when each of the amplifier 1 and the detector 2 has such temperature characteristics that transmission output power is slightly lower at high temperatures than at normal temperatures and higher at low temperatures than at normal temperatures, the temperature detector 8 which consists of a thermistor or the like, for example, detects the temperature of the circuit, and the temperature correction section 6b of the control section 6 controls the D/A converter 3 based on output information from the temperature detector 8 so that, at high temperatures, the output voltage of the D/A converter 3 is increased by the difference from the transmission output power level at normal temperatures, and, at low temperatures, the output voltage is reduced by the difference from the transmission output power level at normal temperatures. In this way, temperature correction can be realized.

Embodiment 4

Figure 9:
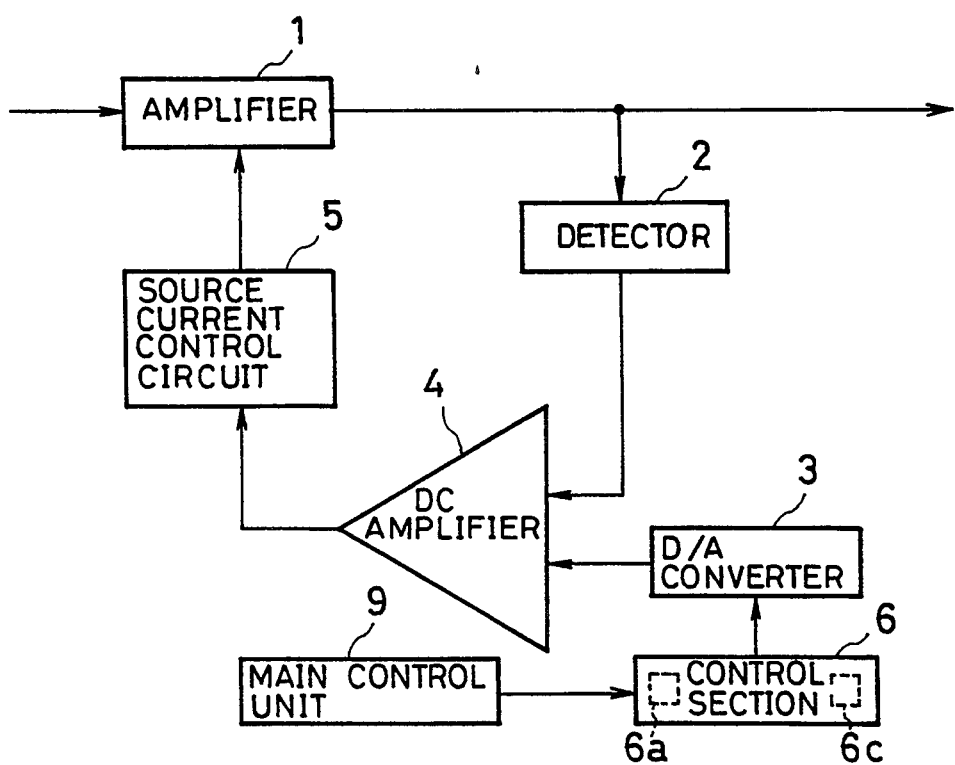
FIG. 9 is a block diagram of Embodiment 4 of the present invention.

When this amplifier circuit is used in a wide frequency band, a main control section 9 and a frequency correction section 6c may be provided, as shown in FIG. 9. Frequency correction can be made by changing the output voltage of the D/A converter 3 so that the frequency correction section 6c of the control section 6 can correct the frequency characteristics of the amplifier 1 and the detector 2 based on frequency information received from the main control section 9 of the device having such a circuit.

For instance, when each of the amplifier 1 and the detector 2 has such frequency characteristics that transmission output power is slightly lower at high and low levels of the used frequency band than at an intermediate level, the frequency correction section 6c in the control section 6 controls the D/A converter 3 for frequency correction so that the output voltage of the D/A converter 3 is increased by the difference from the transmission output voltage at an intermediate level of a use frequency band when the transmission frequency is low or high. In this way, frequency correction can be made.

Embodiment 5

Figure 10:
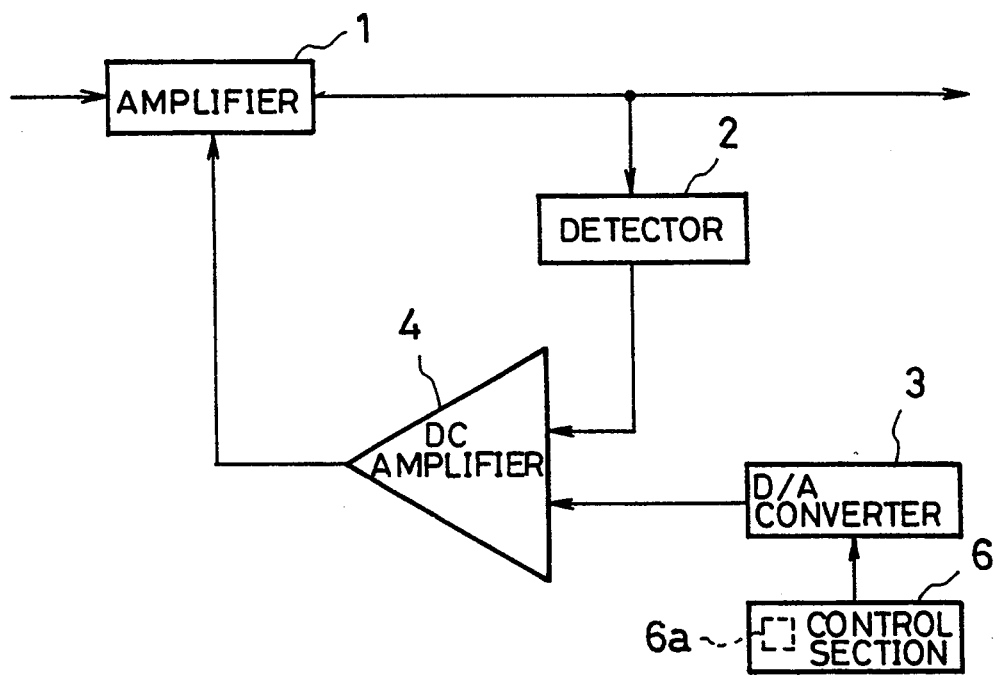
FIG. 10 is a block diagram of Embodiment 5 of the present invention.
Figure 11:
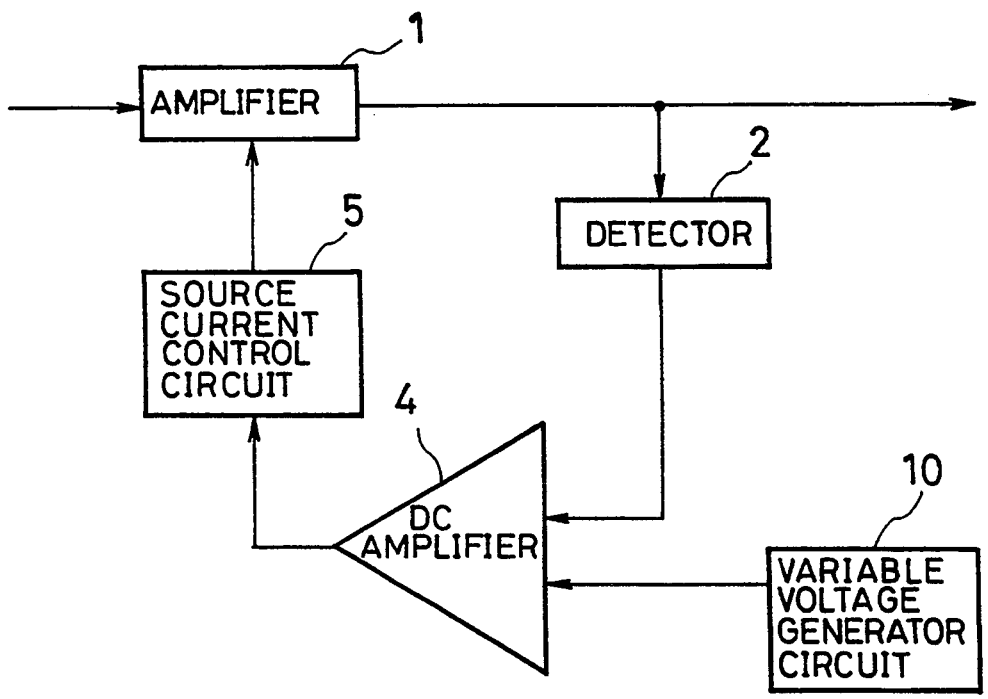
FIG. 11 is a block diagram of a conventional automatic output power control circuit.

In the above embodiments, the output power of the amplifier 1 can be changed by a source current as shown in FIG. 1. However, when the amplifier consists of an FET or the like and the output power of the amplifier is controlled by source voltage as shown in FIG. 10, the source current control circuit may be eliminated and the output power of the amplifier 1 may be controlled directly by the output voltage of the D.C. amplifier. Moreover, the output of the D.C. amplifier 4 may be varied by the control section 6 without changing the input of the D/A converter 3.

As described above, according to the present invention, since the output of the amplifier is changed based on a prestored power variation level, an overshoot or the emission of an undesired spectrum which occurs when output power is turned on or off, or switched can be suppressed, temperature and frequency corrections can be made easily, and a high-accuracy control device for power amplifiers can be obtained.

What is claimed is:

1. A control device for regulating the output power of a power amplifier at a continuous level from among different selected power levels, said control device comprising a detector for detecting the output power of said power amplifier and differential amplifying means for generating a control signal equivalent to the difference between the output of said detector and the output of reference voltage generating means representing a selected power level to control the power level of said amplifier at said selected power level, said control device further comprising storage means for storing a reference power level signal variation pattern representing a variation in reference power level as a function of time for changing the power level of said amplifier in accordance with said function of time from one selected continuous level to another selected continuous level and a control section for changing said control signal as a function of time based on the reference power level signal variation pattern stored in said storage means.

2. A control device for a power amplifier according to claim 1, wherein said control section controls said amplifier upon a rise in output power level.

3. A control device for a power amplifier according to claim 1, wherein said control section controls said amplifier upon a fall in output power level.

4. A control device for a power amplifier according to claim 1, wherein said control section controls said amplifier upon switching of output power level.

5. A control device for a power amplifier according to claim 1, wherein said control section changes the control signal by varying the input of said reference voltage generating means.

6. A control device for a power amplifier according to claim 1, wherein said control section changes the control signal by varying the output of said differential amplifying means.

7. A control device for regulating the output power of a power amplifier at a continuous level from among different selected power levels, said control device comprising a detector for detecting the output power of said power amplifier and differential amplifying means for generating a control signal equivalent to the difference between the output of said output detector and the output of a reference voltage generator means representing a selected power level to control the power level of said amplifier at said selected power level, said control device further comprising storage means for storing a reference power level signal variation pattern representing a variation in reference power level as a function of time for changing the power level of said amplifier in accordance with said function of time from one selected continuous level to another selected continuous level and a control section for changing said control signal as a function of time based on the reference power level signal variation pattern stored in said storage means and a low-pass filter provided on the output side of said reference voltage generating means.

8. A control device for regulating the output power of a power amplifier at a continuous level from among different selected power levels, said control device comprising a detector for detecting the output power of said power amplifier and differential amplifying means for generating a control signal equivalent to the difference between the output of said output detector and the output of a reference voltage generator means representing a selected power level to control the power level of said amplifier at said selected power level, said control device further comprising storage means for storing a reference power level signal variation pattern representing a variation in reference power level as a function of time for changing the power level of said amplifier in accordance with said function of time from one selected continuous level to another selected continuous level, a control section for changing said control signal as a function of time based on the reference power level signal variation pattern stored in said storage means, and a temperature detection section for detecting ambient temperature, and a temperature correction section for correcting the output of said control section based on the output of said temperature detector.

9. A control device for regulating the output power of a power amplifier at a continuous level from among different selected power levels, said control device comprising a detector for detecting the output power of said power amplifier and differential amplifying means for generating a control signal equivalent to the difference between the output of said output detector and the output of a reference voltage generator means representing a selected power level to control the power level of said amplifier at said selected power level, said control device further comprising storage means for storing a reference power level signal variation pattern representing a variation in reference power level as a function of time for changing the power level of said amplifier in accordance with said function of time from one selected continuous level to another selected continuous level, a control section for changing said control signal as a function of time based on the reference power level signal variation pattern stored in said storage means, and a frequency correction section for correcting the output of said control section based on a frequency band of a circuit used in said power amplifier.

* * * * *